United States Patent
Suezawa et al.

(10) Patent No.: US 10,296,057 B2
(45) Date of Patent: May 21, 2019

(54) ELECTRONIC DEVICE

(71) Applicant: KYOCERA Corporation, Kyoto (JP)

(72) Inventors: Satoru Suezawa, Yokohama (JP); Akito Iwai, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/037,438

(22) Filed: Jul. 17, 2018

(65) Prior Publication Data

US 2018/0321712 A1 Nov. 8, 2018

Related U.S. Application Data

(63) Continuation of application No. PCT/JP2017/000838, filed on Jan. 12, 2017.

(30) Foreign Application Priority Data

Jan. 22, 2016 (JP) .................. 2016-010584

(51) Int. Cl.
*H04M 1/03* (2006.01)
*G06F 1/16* (2006.01)
*H05K 5/02* (2006.01)

(52) U.S. Cl.
CPC .......... *G06F 1/1688* (2013.01); *G06F 1/1626* (2013.01); *G06F 1/1658* (2013.01); *H04M 1/035* (2013.01); *H05K 5/02* (2013.01)

(58) Field of Classification Search
CPC ....... H04R 1/342; G06F 1/1688; H04M 1/035
See application file for complete search history.

(56) References Cited

U.S. PATENT DOCUMENTS

| | | | | |
|---|---|---|---|---|
| 5,790,679 | A * | 8/1998 | Hawker | H04M 1/0202 379/388.02 |
| 9,661,410 | B1 * | 5/2017 | Iwai | H04R 1/086 |
| 2006/0258325 | A1 * | 11/2006 | Tsutaichi | H04M 1/03 455/350 |
| 2014/0004913 | A1 | 1/2014 | Kimura et al. | |
| 2015/0256657 | A1 | 9/2015 | Choe et al. | |

(Continued)

FOREIGN PATENT DOCUMENTS

| | | |
|---|---|---|
| JP | S62-203549 U | 12/1987 |
| JP | 2007-060481 A | 3/2007 |
| JP | 2011-114688 A | 6/2011 |

(Continued)

*Primary Examiner* — Adrian S Wilson
(74) *Attorney, Agent, or Firm* — Studebaker & Brackett PC

(57) ABSTRACT

An electronic device includes a first housing component including a first surface and a second surface and including a first through hole which connects the first surface and the second surface to each other, a second housing component removably attached to the first housing component, and an acoustic component located on a first side of the first through hole. The first housing component and the second housing component as being combined with each other define a passage which communicates with the outside. The first housing component includes a third surface. The second housing component includes a fourth surface. On one of the third surface and the fourth surface, a rib which protrudes to abut on the other is located. The rib is located to separate a region including the first through hole from other portions.

5 Claims, 13 Drawing Sheets

(56) References Cited

U.S. PATENT DOCUMENTS

2016/0014488 A1\* 1/2016 Iwaya .................... H04R 3/005
                                                        381/91
2016/0299536 A1\* 10/2016 Mori ...................... H04R 1/342

FOREIGN PATENT DOCUMENTS

| JP | 2015-061190 A | 3/2015 |
| WO | 2012/124348 A1 | 9/2012 |
| WO | 2014/061679 A1 | 4/2014 |

\* cited by examiner

ELECTRONIC DEVICE

CROSS-REFERENCE TO RELATED APPLICATION

The present application is a continuation based on PCT Application No. PCT/JP2017/000838 filed on Jan. 12, 2017, which claims the benefit of Japanese Application No. 2016-010584 filed on Jan. 22, 2016. PCT Application No. PCT/JP2017/000838 is entitled "Electronic Device" and Japanese Application No. 2016-010584 is entitled "Electronic Device." The content of which is incorporated by reference herein in their entirety.

FIELD

An embodiment of the present disclosure relates to an electronic device.

BACKGROUND

An electronic device includes a portable terminal. A portable terminal including a through hole for passage of voice and sound in a housing has been known.

SUMMARY

An electronic device based on the present disclosure includes a first housing component including a first surface which faces a first side and a second surface which faces a second side and including a first through hole which connects the first surface and the second surface to each other, a second housing component removably attached to the second side of the first housing component, and an acoustic component located on the first side of the first through hole. The first housing component and the second housing component as being combined with each other define a passage which communicates to the outside from an end on the second side of the first through hole. The first housing component includes a third surface which faces the second side. The second housing component includes a fourth surface opposed to the third surface. On one of the third surface and the fourth surface, a rib which protrudes to abut on the other is located. The rib is located to separate a region including the first through hole from other portions.

The foregoing and other objects, features, aspects and advantages of the present disclosure will become more apparent from the following detailed description of the present disclosure when taken in conjunction with the accompanying drawings.

DETAILED DESCRIPTION

Figure 1:
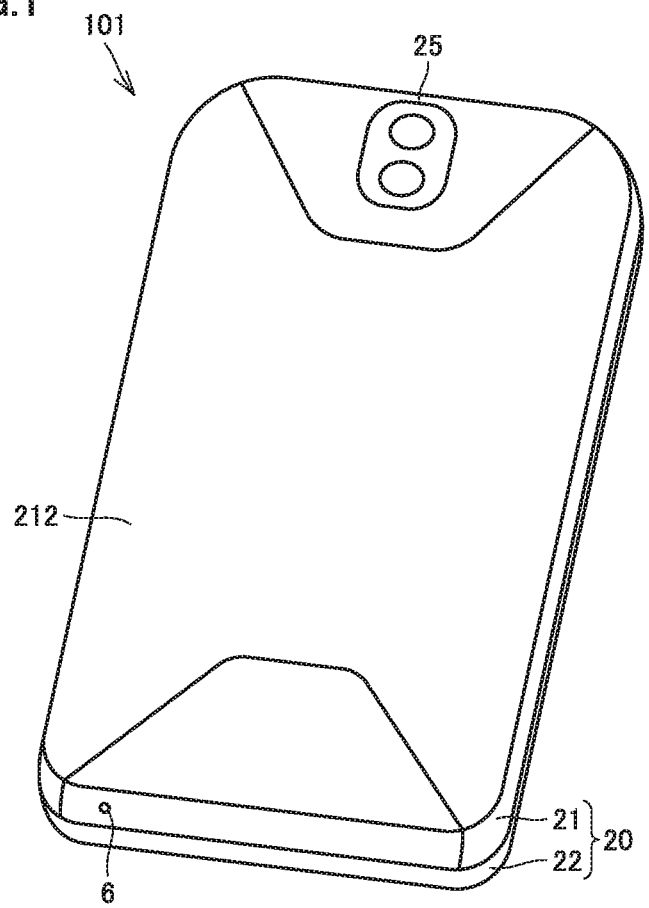
FIG. 1 is a perspective view of an electronic device in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

In the present disclosure, an electronic device capable of suppressing transmission of sounds generated at any portion in a housing to an acoustic component through a gap between components in the housing is desirably provided.

First Embodiment

An electronic device in a first embodiment based on the present disclosure will be described with reference to FIGS. 1 to 8. FIG. 1 shows appearance of the electronic device in the first embodiment. Though description of the electronic device is given here with a smartphone being defined as the electronic device by way of example, a type of the electronic device is not limited to the smartphone.

An electronic device 101 may include a display. FIG. 1 shows a surface opposite to a side where the display of electronic device 101 is located. Electronic device 101 includes a housing 20. An outer geometry of housing 20 is, for example, substantially rectangular. Housing 20 includes a housing component 21 on a rear surface side and a housing component 22 on a front surface side. Housing component 22 may include an opening for a display and a button. FIG. 1 mainly shows housing component 21 on the rear surface side. Electronic device 101 includes, for example, an image pick-up portion 25. Image pick-up portion 25 includes, for example, a camera and a sensor. Housing component 21 includes a first opening 6. In the example shown in FIG. 1, first opening 6 is located in a side surface on a short side of housing component 21.

Figure 2:
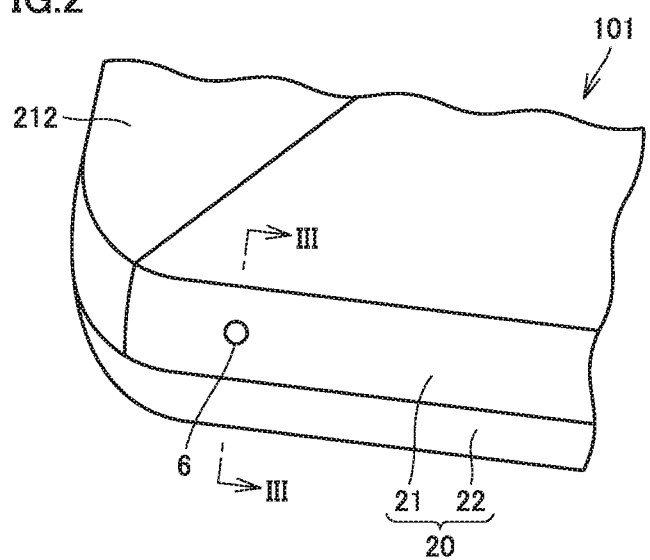
FIG. 2 is a partially enlarged perspective view of a vicinity of a first opening located in the electronic device in the first embodiment based on the present disclosure.
Figure 3:
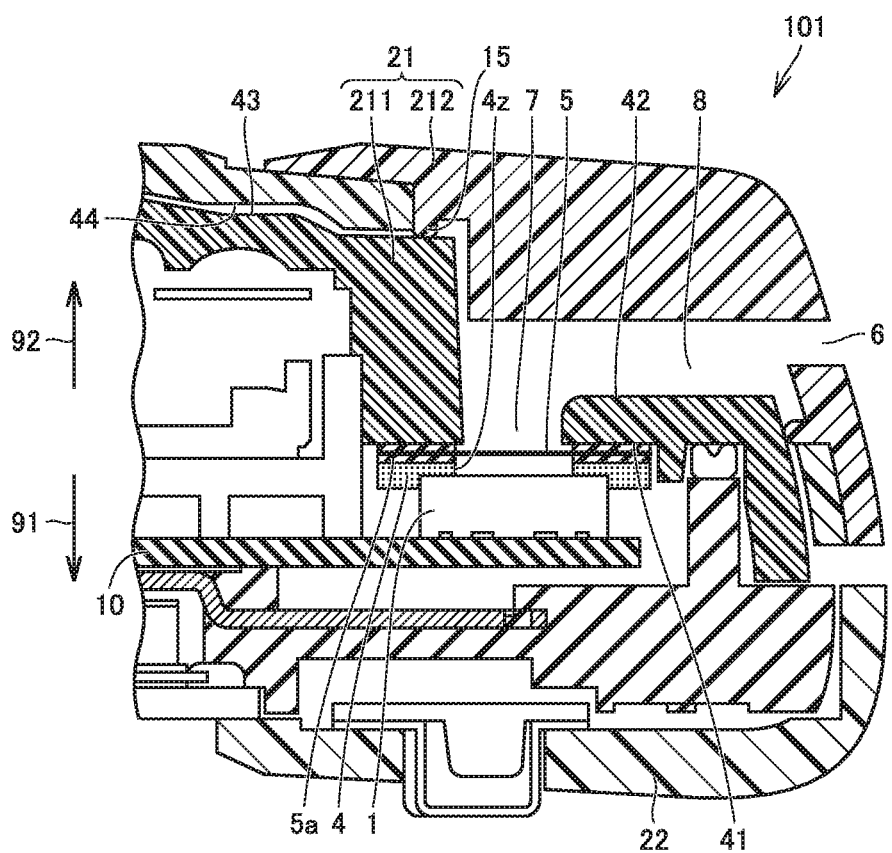
FIG. 3 is a cross-sectional view along the line in FIG. 2.

FIG. 2 shows an enlarged view of a vicinity of first opening 6 in electronic device 101 shown in FIG. 1. FIG. 3 shows a cross-sectional view along the line in FIG. 2.

Housing component 21 includes a first housing component 211 and a second housing component 212. In the example shown here, second housing component 212 is formed through two-color molding. An acoustic component 1 mounted on a substrate 10 is located in a space surrounded by housing component 21 and housing component 22, and acoustic component 1 includes, for example, a microphone. The entire acoustic component 1 may be a microphone. Acoustic component 1 is, for example, columnar. In the example shown here, acoustic component 1 is pressed against an annular elastic member 4. When acoustic component 1 is columnar, for example, a circular annular member is employed for elastic member 4. Elastic member 4 has a circular outer geometry and includes a circular through hole 4z in the center. A waterproof film 5 held by a waterproof film holding portion 5a is located on elastic member 4. Waterproof film 5 is a film permeable to air and also to vibration of air but impermeable to water. Waterproof film 5 can be made with a known technique. Elastic member 4 and waterproof film holding portion 5a are layered to form a layered body. In the example shown here, elastic member 4 is substantially equal in outer diameter to waterproof film holding portion 5a. Elastic member 4 is substantially equal in inner diameter to waterproof film holding portion 5a. An internal space in through hole 4z in elastic member 4 is a space adjacent to a central portion of acoustic component 1.

Figure 4:
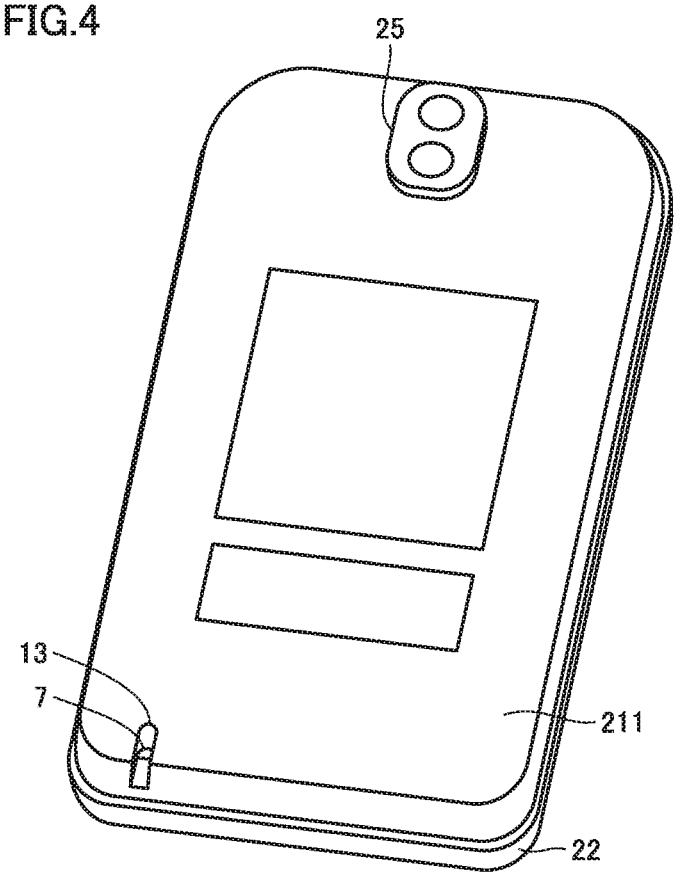
FIG. 4 is a perspective view of the electronic device shown in FIG. 1 from which a second housing component has been removed.
Figure 5:
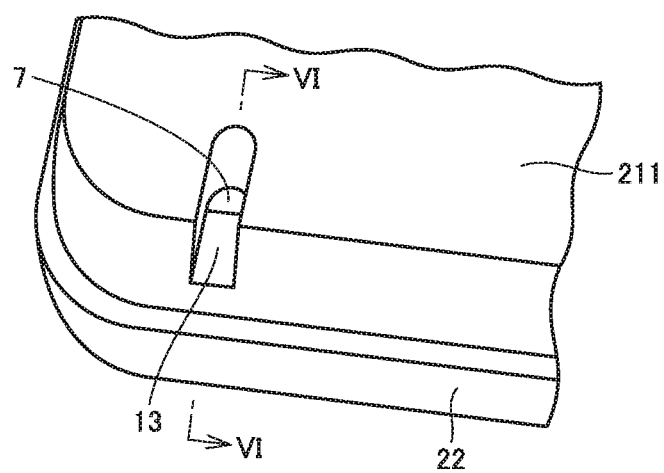
FIG. 5 is a partially enlarged perspective view of a vicinity of a first groove in the electronic device in the first embodiment based on the present disclosure.
Figure 6:
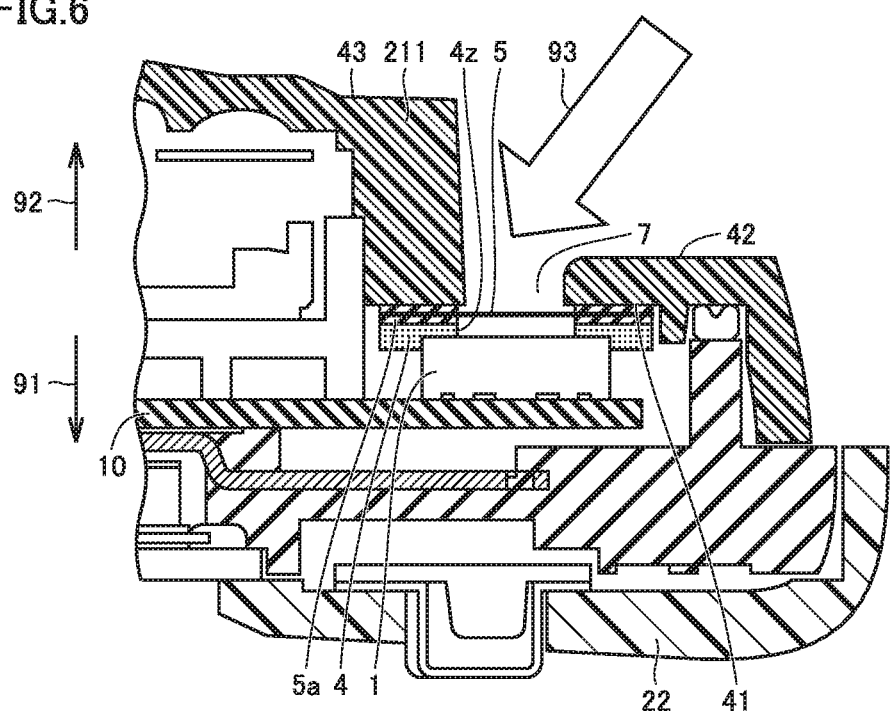
FIG. 6 is a cross-sectional view along the line VI-VI in FIG. 5.

FIG. 4 shows electronic device 101 shown in FIG. 1 from which second housing component 212 has been removed. First housing component 211 is seen with second housing component 212 having been removed. A first groove 13 is located in a part of first housing component 211. A first through hole 7 is located on an extension of first groove 13. A position of first groove 13 corresponds to a position of first opening 6 shown in FIGS. 1 and 2. FIG. 5 shows an enlarged view of a vicinity of first groove 13 shown in FIG. 4. FIG. 6 shows a cross-sectional view along the line VI-VI in FIG. 5.

As shown in FIG. 3, electronic device 101 in the first embodiment includes first housing component 211, second housing component 212, and acoustic component 1. First housing component 211 includes a first surface 41 which faces a first side 91 and a second surface 42 which faces a second side 92 and includes first through hole 7 which connects first surface 41 and second surface 42 to each other. Second housing component 212 is removably attached to second side 92 of first housing component 211. Acoustic component 1 is located on first side 91 of first through hole 7. First housing component 211 and second housing component 212 as being combined with each other define a passage 8 which communicates to the outside from an end on second side 92 of first through hole 7. First housing component 211 includes a third surface 43 which faces second side 92. Second housing component 212 includes a fourth surface 44 opposed to third surface 43. On one of third surface 43 and fourth surface 44, a rib protruding to abut on the other is located. Though a rib may be located on any of third surface 43 and fourth surface 44, a rib 15 protruding to abut on third surface 43 is located on fourth surface 44 in the example shown in FIG. 3. Rib 15 is located to separate a region including first through hole 7 from other portions. Rib 15 may be linear or curved. Rib 15 is not limited to be continuous but may be discontinuous. Rib 15 should only be able to separate the region including first through hole 7 from other portions and separation does not have to be perfect.

In electronic device 101, waterproof film 5 is located to cover first through hole 7. Acoustic component 1 is located on first side 91 of waterproof film 5. As shown in FIG. 6, first through hole 7 is in such a shape that waterproof film 5 can directly be seen when first side 91 is viewed from second side 92 while second housing component 212 is not attached to first housing component 211. As shown in FIG. 3, first housing component 211 and second housing component 212 as being combined with each other define passage 8 which communicates to the outside from the end on second side 92 of first through hole 7.

Figure 7:
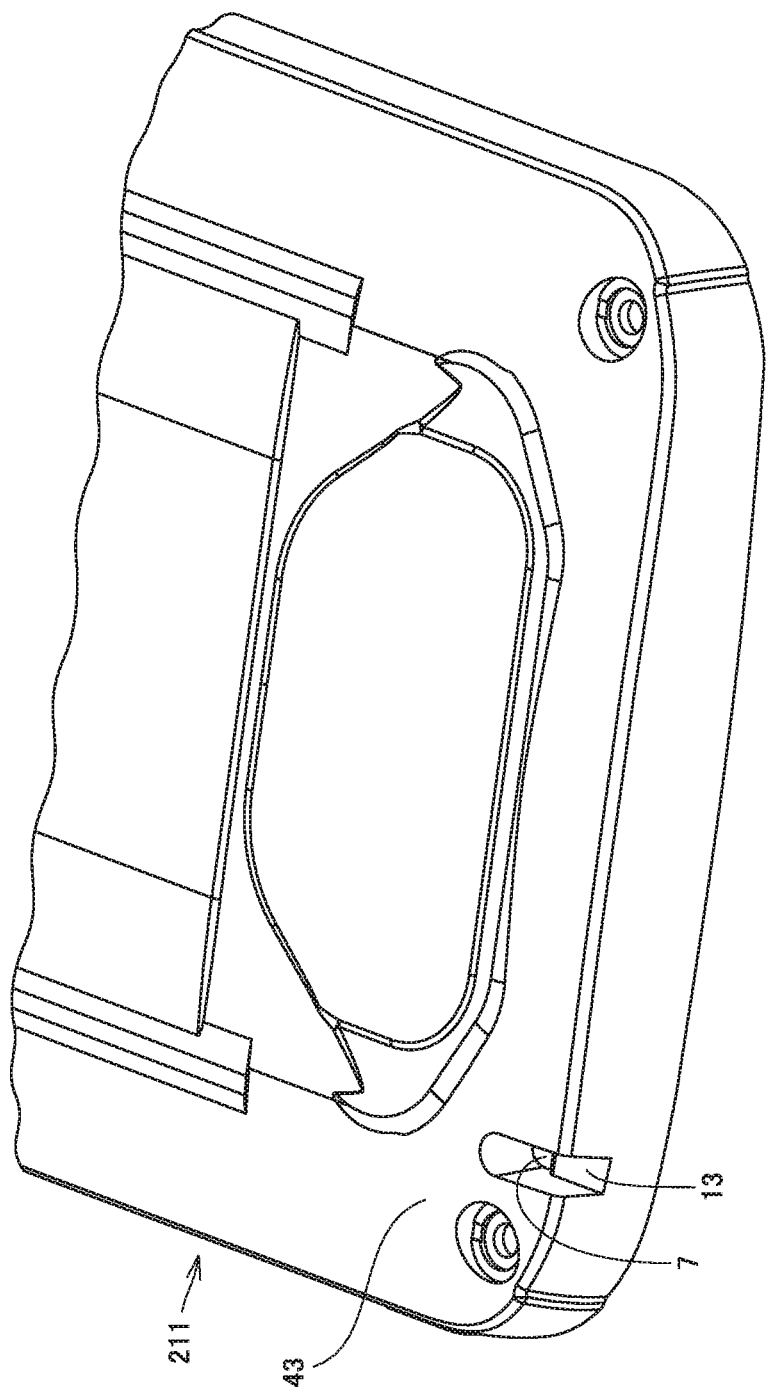
FIG. 7 is a partial perspective view of the first housing component included in the electronic device in the first embodiment based on the present disclosure, the first housing component being taken out alone and viewed in a first direction.
Figure 8:
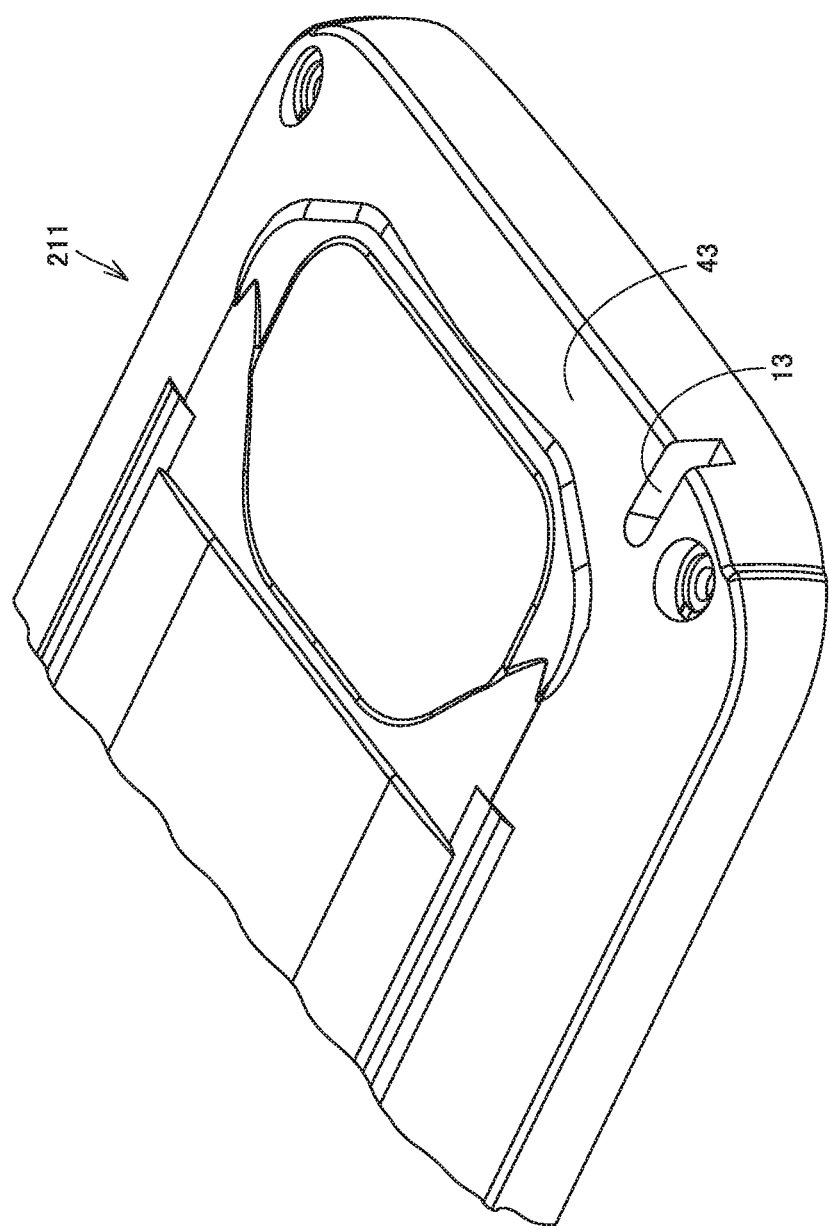
FIG. 8 is a partial perspective view of the first housing component included in the electronic device in the first embodiment based on the present disclosure, the first housing component being taken out alone and viewed in a second direction.

FIG. 7 shows first housing component 211 taken out alone. FIG. 8 shows first housing component 211 viewed in a direction different from the direction in FIG. 6. Though third surface 43 of first housing component 211 is seen in FIGS. 7 and 8, third surface 43 may include minor projections and recesses as shown in FIGS. 7 and 8. Third surface 43 is not necessarily a completely flat surface.

In the first embodiment, on one of third surface 43 and fourth surface 44, rib 15 protruding to abut on the other is located. Since rib 15 separates the region including first through hole 7 from other portions, transmission of sounds generated at any portion in the housing to the acoustic component through a gap between components in the housing can be suppressed. "Sounds generated at any portion in the housing" here include not only sounds generated by some device in the electronic device but also a rustle caused when a user touches an outer surface of the housing, that is, an outer surface of second housing component 212. This is also applicable to second and third embodiments which will be described later.

In cleaning electronic device 101, it may be cleaned with second housing component 212 being removed.

Though an example in which acoustic component 1 is located to be opposed to first through hole 7 as shown in FIG. 3 is shown in the first embodiment, acoustic component 1 is not necessarily located to be opposed to first through hole 7. Acoustic component 1 should only be located on first side 91 of first through hole 7 and may face a different direction without facing first through hole 7. For example, acoustic component 1 may be located at a position distant from waterproof film 5. Acoustic component 1 may be located out of an area where first through hole 7 is projected on first side 91.

First through hole 7 and passage 8 serve to transmit sounds which have reached electronic device 101 from the outside to acoustic component 1. Alternatively, first through hole 7 and passage 8 serve to transmit sounds generated from acoustic component 1 to the outside of electronic device 101. Sounds can freely go back and forth through first through hole 7 and passage 8 between acoustic component 1 and a space outside housing 20. When waterproof film 5 is located in the vicinity of first through hole 7, sounds pass through also waterproof film 5.

Figure 9:
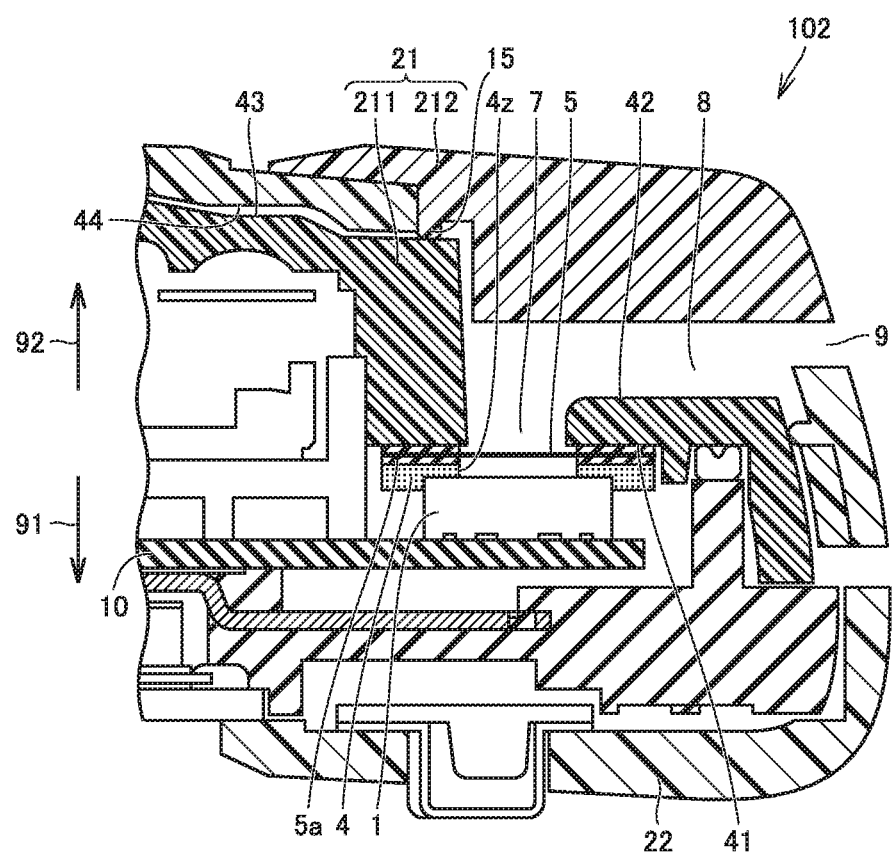
FIG. 9 is a partial cross-sectional view of a first modification of the electronic device in the first embodiment based on the present disclosure.

As shown in FIGS. 1 to 3, second housing component 212 includes first opening 6 which opens to the outside and passage 8 may communicate with the outside through first opening 6. By adopting this construction, passage 8 can communicate with the outside at a desired position in second housing component 212. When second housing component 212 does not include first opening 6, a construction like an electronic device 102 shown in FIG. 9 is applicable. In electronic device 102, it is not that second housing component 212 alone includes an opening. With first housing component 211 and second housing component 212 being combined with each other, an exit 9 of passage 8 is defined at a boundary between first housing component 211 and second housing component 212. In order to obtain such exit 9, for example, at least any one of first housing component 211 and second housing component 212 may include a cut and the one may be combined with the other, so that a certain opening is defined.

As shown in the first embodiment, first housing component 211 may include first groove 13 on second side 92 and first groove 13 may communicate with first through hole 7. By adopting this construction, first groove 13 can guide voice and sound. For example, when acoustic component 1 is an apparatus which picks up voice and sound such as a microphone, voice and sound which come in through first opening 6 can be guided to first through hole 7 through first groove 13 even though first through hole 7 is distant from first opening 6. For example, when acoustic component 1 is an apparatus which emits voice and sound such as a speaker, voice and sound emitted from acoustic component 1 can be guided to first opening 6 through first groove 13 even though first through hole 7 is distant from first opening 6.

As shown in the first embodiment, an inner surface of passage 8 may include a part of an inner surface of first groove 13. By adopting this construction, passage 8 can readily be formed.

In the example shown here, as shown in FIG. 3, waterproof film 5 covers first through hole 7 by being located on first side 91 of first through hole 7, however, limitation to such a manner of covering is not intended. For example, waterproof film 5 may be located on second side 92 of first through hole 7. Waterproof film 5 may be located on second surface 42 instead of first surface 41. Waterproof film 5 may be located at any position in first through hole 7.

In the example shown here, as shown in FIGS. 1 to 3, housing component 21 and housing component 22 are combined with each other to form housing 20, and housing component 21 includes first housing component 211 and second housing component 212. Limitation thereto, however, is not intended. For example, a portion corresponding to first housing component 211 may be a part of housing component 22. In that case, though housing component 21 includes second housing component 212, it does not include first housing component 211. In the example shown here, housing component 21 is a component on the rear surface side of the electronic component and housing component 22 is a component on the front surface side of the electronic component, and vice versa.

Since a tip end of rib 15 abuts on third surface 43, rib 15 may be formed of a soft material. Rib 15 may be formed of an elastic material. When rib 15 is formed of an elastic material, the tip end of rib 15 can readily be deformed by compression by being pressed against third surface 43. Therefore, a problem of a dimension error can be lessened and smooth assembly can be allowed. Pressing of the tip end of rib 15 by being deformed by compression to some extent can achieve sufficiently intimate contact without producing a gap between rib 15 and third surface 43. Rib 15 may be formed of an elastic material also in embodiments below.

Since the first embodiment can achieve an effect so long as rib 15 is located in second housing component 212, it does not require a new component. Therefore, increase in number of components can be avoided.

Figure 10:
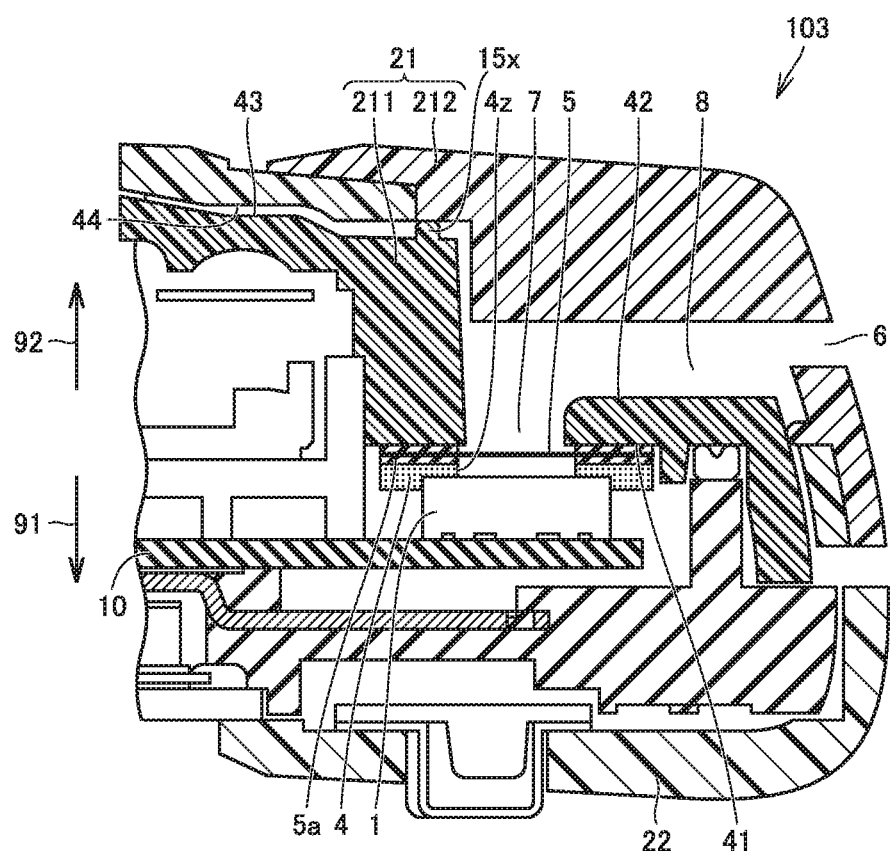
FIG. 10 is a partial cross-sectional view of a second modification of the electronic device in the first embodiment based on the present disclosure.

Though an example in which rib 15 protruding to abut on third surface 43 is located on fourth surface 44 is described in the first embodiment, a surface where a rib should be located is not limited to fourth surface 44 but the rib may be located on third surface 43 as described above. For example, a construction like an electronic device 103 shown in FIG. 10 may be applicable. Though electronic device 103 is common to electronic device 101 in basic construction, a rib 15x is located on third surface 43 of first housing component 211 and rib 15x abuts on fourth surface 44 of second housing component 212. Similarly to rib 15, rib 15x may also be formed of an elastic material. Description of a shape of a rib which will be given later is also similarly applicable to rib 15x.

The first embodiment shows an example in which second surface 42 and third surface 43 located in first housing component 211 are at different heights as shown in FIG. 3. This is merely by way of example and second surface 42 and third surface 43 may be flush with each other. Second surface 42 and third surface 43 may be, for example, a continuous surface. For example, one portion on the same continuous surface may be regarded as second surface 42 and another portion may be regarded as third surface 43.

Second Embodiment

An electronic device in a second embodiment based on the present disclosure will be described with reference to FIGS. 11 to 15 in addition to FIGS. 1 to 8. Since the electronic device in the second embodiment is similar in basic construction to the electronic device described in the first embodiment, description will not be repeated. The description in the first embodiment with reference to FIGS. 1 to 8 is also applicable to the electronic device in the second embodiment.

A rib 15h in a U shape is located on fourth surface 44 of second housing component 212 in the second embodiment, which will be described in detail below.

Figure 11:
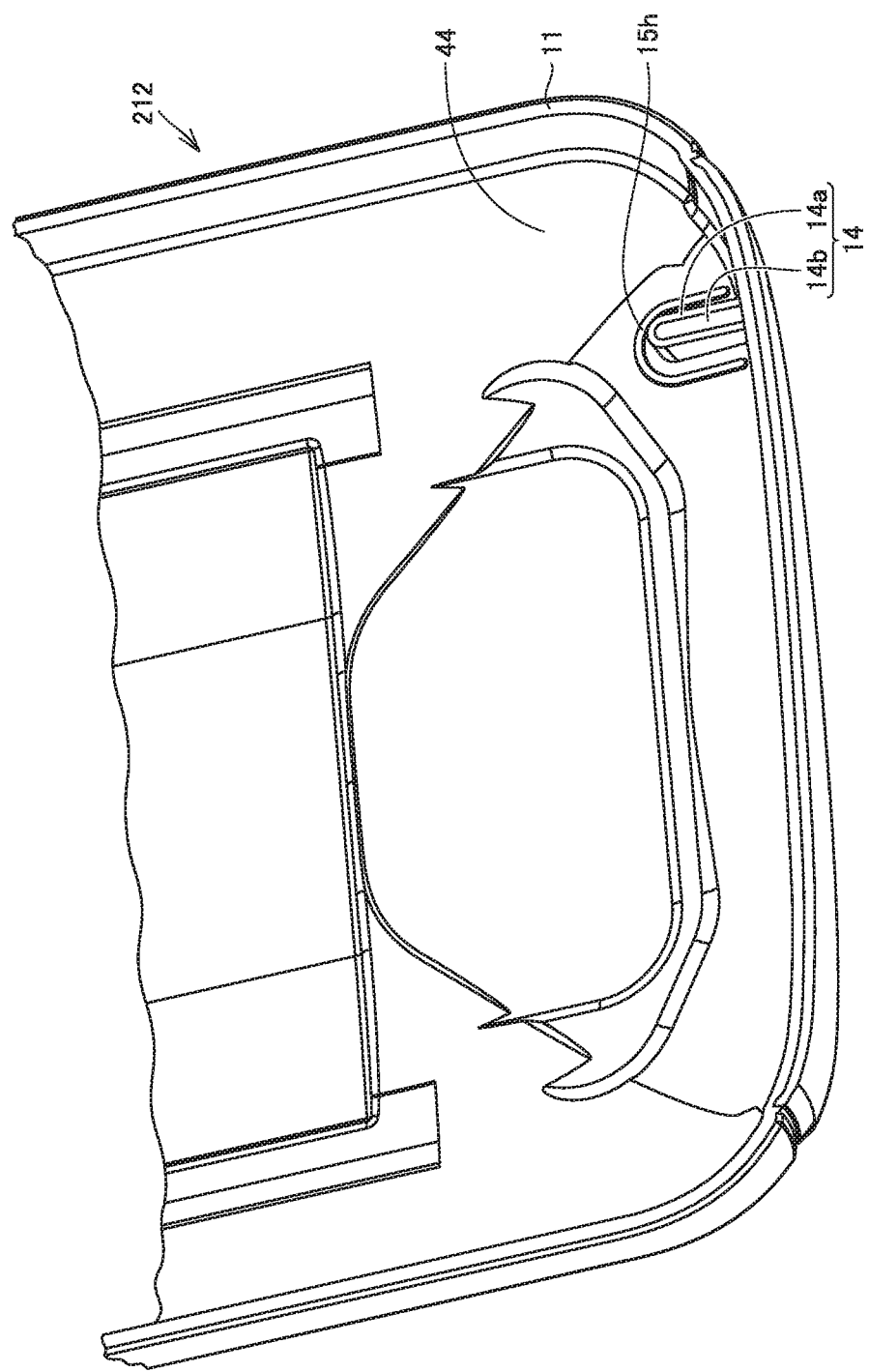
FIG. 11 is a partial perspective view of a rear side of the second housing component included in an electronic device in a second embodiment based on the present disclosure, the second housing component being taken out alone and viewed in a first direction.
Figure 12:
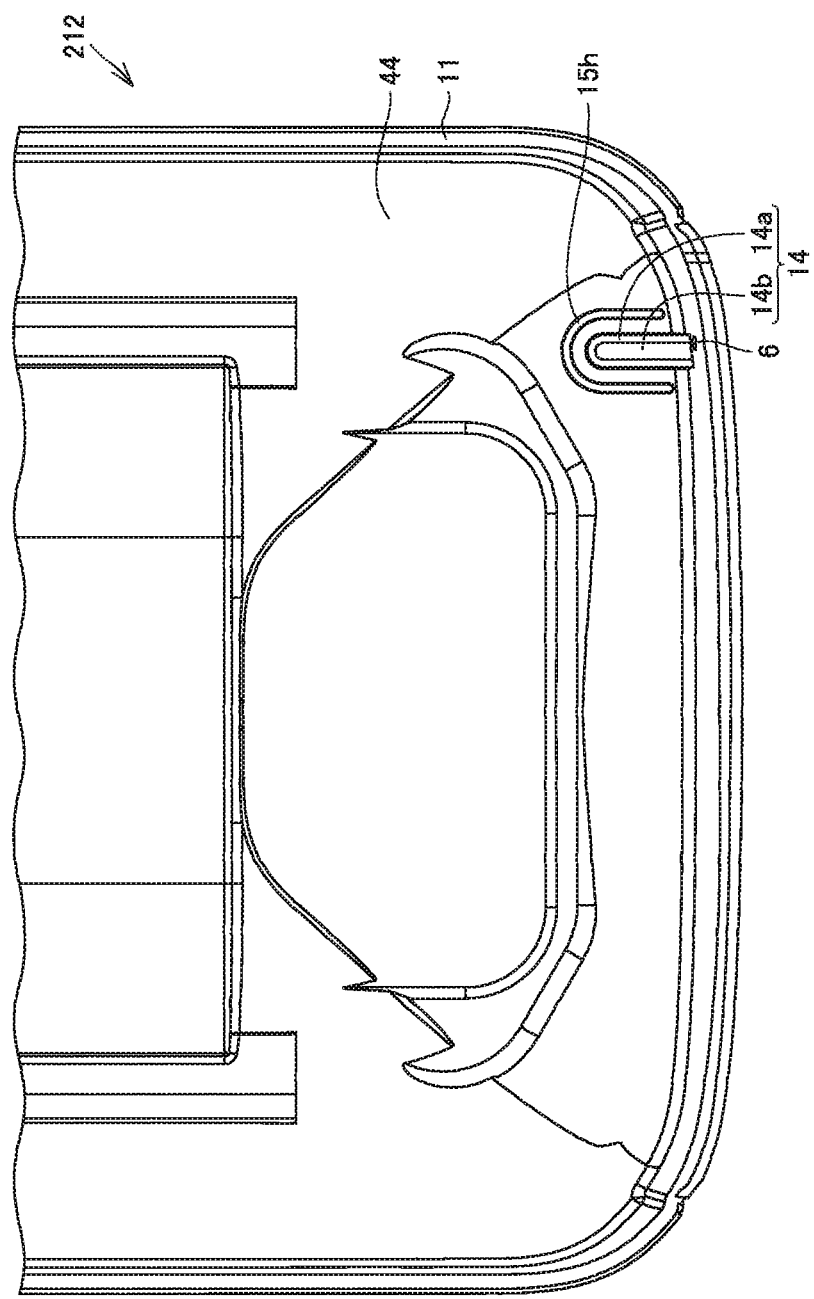
FIG. 12 is a partial plan view of the rear side of the second housing component included in the electronic device in the second embodiment based on the present disclosure, the second housing component being taken out alone and viewed in a perpendicular direction.
Figure 13:
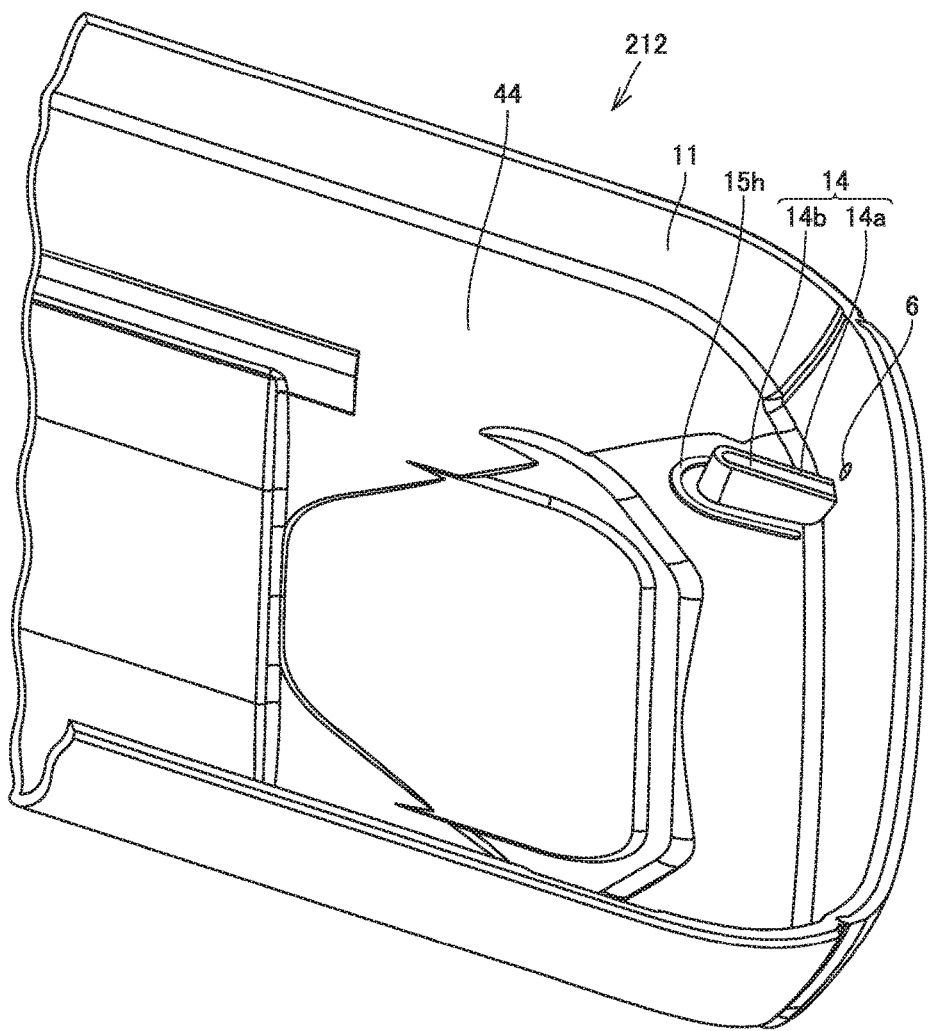
FIG. 13 is a partial perspective view of the rear side of the second housing component included in the electronic device in the second embodiment based on the present disclosure, the second housing component being taken out alone and viewed in a second direction.

FIG. 11 shows a rear side of second housing component 212 included in the electronic device in the second embodiment as being taken out alone. FIG. 12 shows the rear side of second housing component 212 viewed in a perpendicular direction. FIG. 13 shows second housing component 212 when viewed in a further different direction.

Second housing component 212 includes a sidewall portion 11. First opening 6 is located in sidewall portion 11. A surface on an inner side surrounded by sidewall portion 11 of second housing component 212 is defined as fourth surface 44. A projection 14 is located at a position on the inner side of sidewall portion 11 which corresponds to first groove 13 when second housing component 212 is attached to first housing component 211. In the example shown here, projection 14 continues to sidewall portion 11. Projection 14 includes, for example, a first material portion 14a and a second material portion 14b. Second material portion 14b is located as being surrounded by first material portion 14a. First material portion 14a and second material portion 14b are integrally formed, for example, through two-color molding. Projection 14 may be formed of a single material. Projection 14 is formed like a wall. Projection 14 is in such a shape that it can enter first groove 13. A thickness of projection 14 is smaller than a width of first groove 13. First opening 6 is located on the centerline of projection 14.

Rib 15h is located to surround projection 14. Rib 15h may be distant from projection 14. As shown in FIG. 12, rib 15h is in a U shape or an L shape when viewed in the direction perpendicular to the surface where rib 15h is located. Since rib 15h is located on fourth surface 44 in the example shown in the second embodiment, the rib should only be in the U shape or the L shape when viewed in the direction perpendicular to fourth surface 44. In the second embodiment, rib 15h is in the U shape by way of example. Rib 15h when viewed from fourth surface 44 is lower in height than projection 14.

Figure 14:
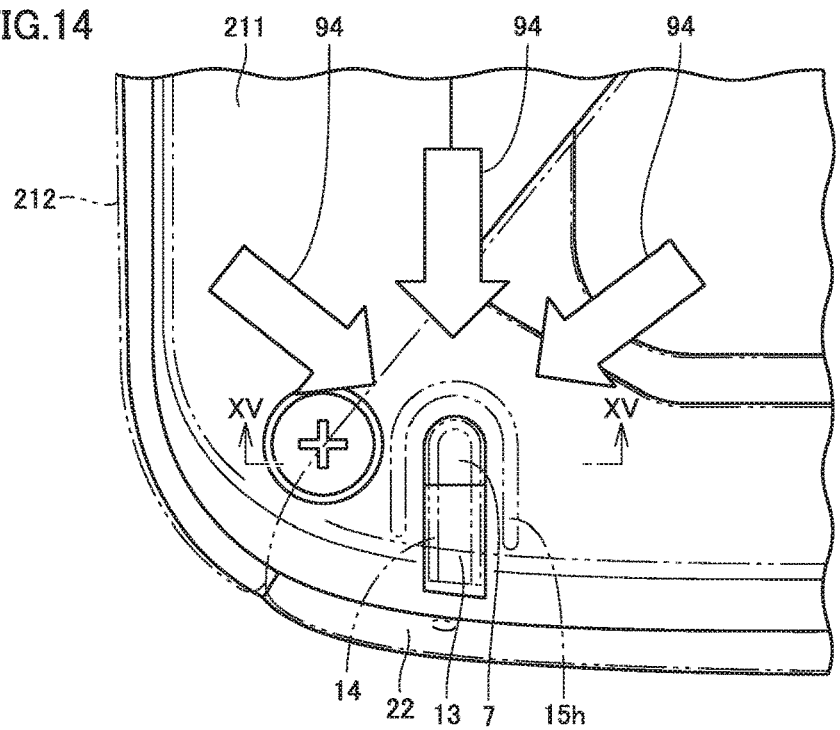
FIG. 14 is a partially enlarged perspective view of the electronic device in the second embodiment based on the present disclosure.
Figure 15:
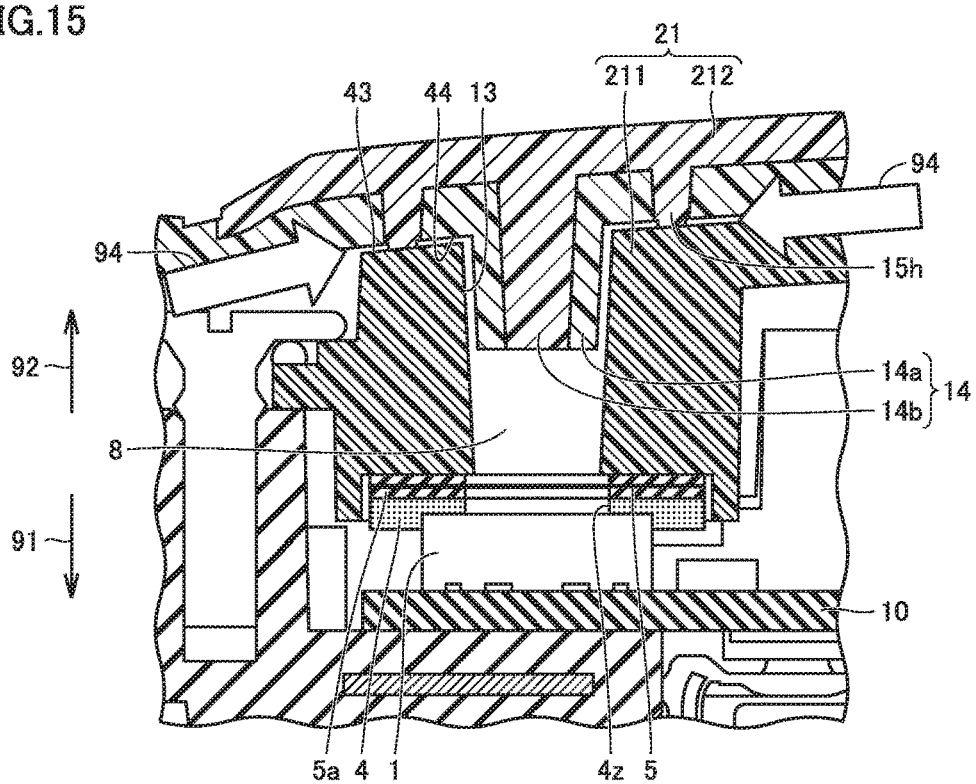
FIG. 15 is a cross-sectional view along the line XV-XV in FIG. 14.

FIG. 14 shows a part of the electronic device in the second embodiment as being enlarged. FIG. 14 shows second housing component 212 as being transparent. FIG. 14 shows second housing component 212 with a chain double dotted line and shows first housing component 211 with a solid line. In the example shown here, rib 15h is in such a U shape as surrounding first groove 13. FIG. 15 shows a cross-sectional view along the line XV-XV in FIG. 14. Projection 14 located in second housing component 212 is fitted into first groove 13 in first housing component 211. An approximately upper half of an internal space in first groove 13 in FIG. 15 is occupied by projection 14, so that an approximately lower half remains and the remaining portion defines passage 8. In FIG. 15, passage 8 extends in a direction forward from the rear on the sheet plane.

As shown in FIGS. 14 and 15, rib 15h is located to separate the region including first through hole 7 from other portions. Alternatively, when there is first groove 13, a construction as follows may be applicable. First housing component 211 includes third surface 43 which faces second side 92, second housing component 212 includes fourth surface 44 opposed to third surface 43, rib 15h protruding to abut on third surface 43 is located on fourth surface 44, and rib 15h is located to separate a region including first through hole 7 and first groove 13 from other portions.

In the example shown in FIG. 15, second housing component 212 is formed through two-color molding. Second housing component 212 is formed of a combination of a hard material and a soft material. The hard material here may be, for example, a polycarbonate resin. The soft material here may be, for example, elastomer. Projection 14 may include first material portion 14a and second material portion 14b. First material portion 14a may be formed of a hard material and second material portion 14b may be formed of a soft material.

In the second embodiment, rib 15h is located. Therefore, even though sounds generated at any portion in the housing is transmitted through a gap between first housing component 211 and second housing component 212 as shown with an arrow 94 in FIGS. 14 and 15, rib 15h prevents the sounds from entering first through hole 7, or first through hole 7 and first groove 13. Therefore, even though acoustic component 1 is an apparatus with a function to pick up voice and sound such as a microphone, undesired sounds can be prevented from being picked up by acoustic component 1.

Though an example in which the rib is in the U shape is described in the second embodiment, the rib may be in the L shape.

Third Embodiment

An electronic device in a third embodiment based on the present disclosure will be described with reference to FIGS. 16 and 17. Since the electronic device in the third embodiment is similar in basic construction to the electronic device described in the first embodiment, description will not be repeated.

Figure 16:
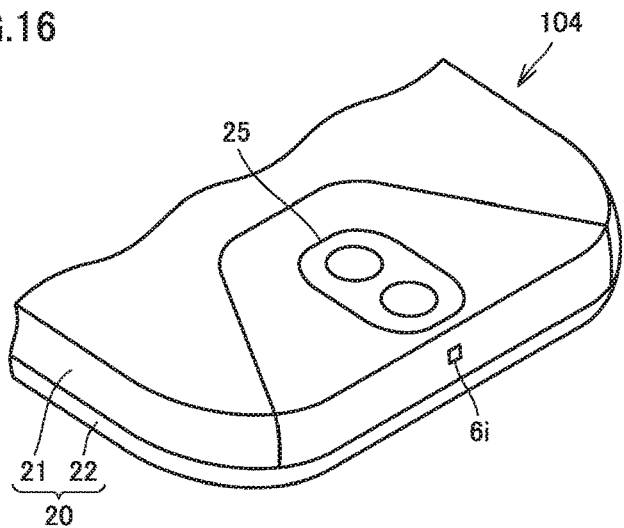
FIG. 16 is a partial perspective view of an electronic device in a third embodiment based on the present disclosure.

FIG. 16 shows a part of the electronic device in the third embodiment. An electronic device 104 includes housing 20. Housing 20 includes housing component 21 and housing component 22. Electronic device 104 includes image pick-up portion 25. A first opening 6i is located in a side surface of housing component 21. Though first opening 6i is located at a position close to image pick-up portion 25 in the example shown here, this is merely by way of example and first opening 6i is not necessarily located at such a position. Presence of image pick-up portion 25 is not essential, but the image pick-up portion is merely illustrated for the sake of convenience of description.

Figure 17:
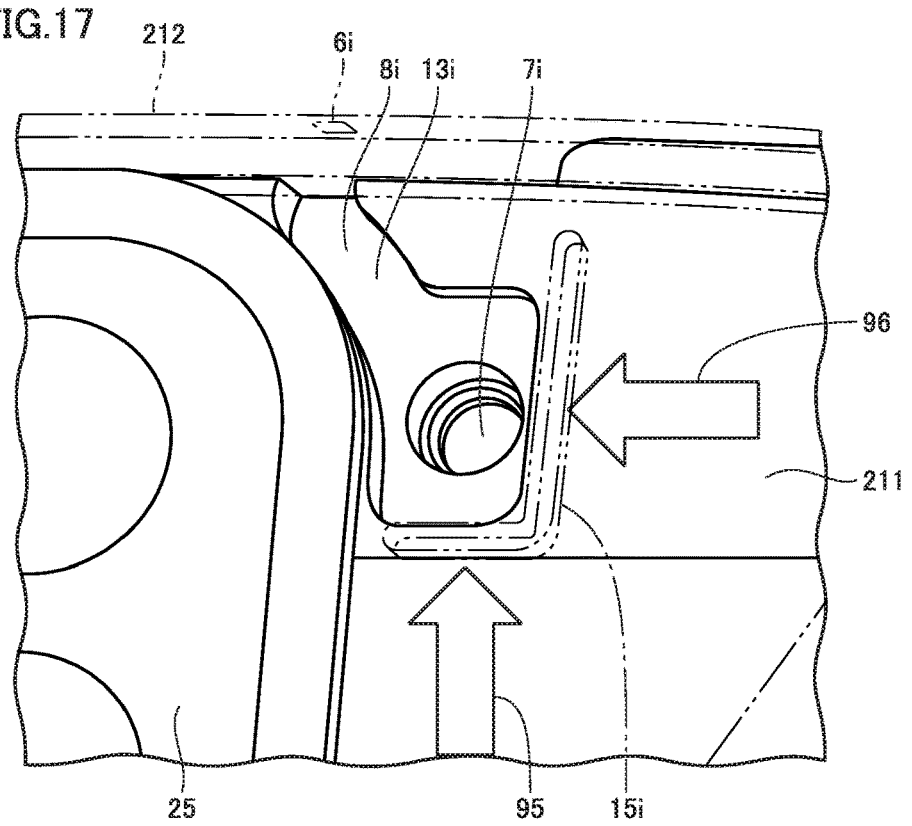
FIG. 17 is a partially enlarged perspective view of the electronic device in the third embodiment based on the present disclosure.

FIG. 17 shows a vicinity of first opening 6i in electronic device 104 with second housing component 212 being transparent. FIG. 17 shows second housing component 212 with a chain double dotted line and shows first housing component 211 with a solid line. Housing component 21 includes first housing component 211 and second housing component 212. First opening 6i is located in a sidewall portion of second housing component 212. A first groove 13i and a first through hole 7i are located in first housing component 211. First groove 13i is located to connect first opening 6i and first through hole 7i to each other. A passage 8i is defined as first groove 13i is closed by second housing component 212.

A rib 15i is located on a surface of second housing component 212 opposed to first housing component 211. Rib 15i is in the L shape. A portion around first through hole 7i in first housing component 211 is recessed over a substantially rectangular area. First groove 13i is connected to this recessed portion. Rib 15i is located along two sides of the recessed portion on a side far from first groove 13i.

In the third embodiment, rib 15i is located. Therefore, even though sounds generated at any portion in the housing are transmitted through a gap between first housing component 211 and second housing component 212 as shown with arrows 95 and 96 in FIG. 17, rib 15i prevents the sounds from entering first through hole 7 and the recessed portion around the same. Therefore, even though acoustic component 1 is an apparatus which picks up voice and sound such as a microphone, undesired sounds can be prevented from being picked up by acoustic component 1. Though there is a small gap between an upper end of rib 15i and an outer edge of first housing component 211 and between a left end of rib 15i and image pick-up portion 25 in FIG. 17, such a small gap may be present. In the construction shown in FIG. 17, rib 15i can block most of transmitted sounds and hence a sufficient effect can be obtained.

Acoustic component 1 may include a microphone in any of the first to third embodiments. Since the microphone is an apparatus which picks up voice and sound, a particularly noticeable effect is obtained when acoustic component 1 includes a microphone.

Though a construction in which rib 15, 15h, or 15i is located is described in the first to third embodiments, a structure with a rib for preventing sounds transmitted through a gap between housing components from entering an acoustic component is not limited to the electronic device including waterproof film 5 as described in the first embodiment. For example, there may be no waterproof film 5 but acoustic component 1 may be located to close first through hole 7 on a side of first surface 41. When the electronic device includes waterproof film 5, the electronic device can be waterproof. For example, waterproof film 5 may be located between first through hole 7 and acoustic component 1. By adopting this construction, even though the electronic device is wet, acoustic component 1 can be prevented from being in contact with water.

Regardless of whether or not first through hole 7 is in such a shape that waterproof film 5 is directly seen when first side 91 is viewed from second side 92, a rib structure is applicable. Though second surface 42 and third surface 43 may be located at different height positions, they may be substantially flush with each other.

Some features in an embodiment above may be adopted as being combined as appropriate.

Though description has been given so far by using the term "electronic device," the electronic device is a broad concept covering, for example, a portable telephone, a portable information terminal, a tablet terminal, a personal computer, a game console, a television receiver, a portable music player, a CD player, a DVD player, an electronic calculator, an electronic organizer, an electronic dictionary, an electronic book reader, a digital camera, a video camera, a radio receiver, a navigation system, and a measurement instrument. The concept of the portable telephone or the portable information terminal includes a smartphone.

Though embodiments of the present disclosure have been described, it should be understood that the embodiments disclosed herein are illustrative and non-restrictive in every respect. The scope of the present disclosure is defined by the terms of the claims and is intended to include any modifications within the scope and meaning equivalent to the terms of the claims.

The invention claimed is:

1. An electronic device comprising:
a first housing component including a first surface which faces a first side and a second surface which faces a second side and including a first through hole which connects the first surface and the second surface to each other;
a second housing component removably attached to the second side of the first housing component; and
an acoustic component located on the first side of the first through hole,
the first housing component and the second housing component as being combined with each other defining a passage which communicates with outside from an end on the second side of the first through hole, the first housing component including a third surface which faces the second side, the second housing component including a fourth surface opposed to the third surface, a rib being located on one of the third surface and the fourth surface, the rib protruding to abut on the other of the third surface and the fourth surface, and the rib being located to separate a region including the first through hole from other portion.

2. The electronic device according to claim 1, wherein the rib is in a U shape or an L shape when viewed in a direction perpendicular to a surface where the rib is located.

3. The electronic device according to claim 1, wherein the rib is formed of an elastic material.

4. The electronic device according to claim 1, wherein a waterproof film is located between the first through hole and the acoustic component.

5. The electronic device according to claim 1, wherein the second housing component includes a first opening which opens to the outside and the passage communicates with the outside through the first opening.

* * * * *